United States Patent
Campardo et al.

[11] Patent Number: 6,150,844
[45] Date of Patent: Nov. 21, 2000

[54] HIGH VOLTAGE TOLERANCE OUTPUT STAGE

[75] Inventors: Giovanni Campardo, Bergamo; Stefano Zanardi, Seriate; Carla Golla, Sesto San Giovanni, all of Italy

[73] Assignee: SGS-Thomson Microelectronics S.r.l., Agrate Brianza, Italy

[21] Appl. No.: 08/898,811

[22] Filed: Jul. 23, 1997

[30] Foreign Application Priority Data

Jul. 24, 1996 [EP] European Pat. Off. ............ 96830413

[51] Int. Cl.[7] .................. H03K 19/0175; H03K 19/02; H03L 5/00
[52] U.S. Cl. .............. 326/81; 326/121; 326/57; 327/333
[58] Field of Search .................. 326/80, 81, 83, 326/86, 121, 57, 58; 327/333, 534

[56] References Cited

U.S. PATENT DOCUMENTS

| | | | |
|---|---|---|---|
| 5,451,889 | 9/1995 | Heim et al. | 326/81 |
| 5,512,844 | 4/1996 | Nakakura et al. | 326/58 |
| 5,543,733 | 8/1996 | Mattos et al. | 326/81 |
| 5,574,389 | 11/1996 | Chu | 326/81 |
| 5,576,635 | 11/1996 | Partovi et al. | 326/83 |
| 5,721,508 | 2/1998 | Rees | 326/81 |

FOREIGN PATENT DOCUMENTS 0 621 692  10/1994  European Pat. Off. ....... H03K 19/00

OTHER PUBLICATIONS

European Search Report from European Patent Application 96830413.9, filed Jul. 24, 1997.

*Primary Examiner*—Michael Tokar
*Assistant Examiner*—James H Cho
*Attorney, Agent, or Firm*—Wolf, Greenfield & Sacks, P.C.; James H.. Morris; Theodore E. Galanthay

[57] ABSTRACT

An output stage for electronic circuits with high voltage tolerance and of the type comprising an output buffer made up of a complementary transistor pair comprising a P-channel MOS pull-up transistor and an N-channel MOS pull-down transistor. The transistors are connected together to make up an output terminal of the stage which comprises in addition a switch having an input connected to the output terminal of the stage and an output connected to the control terminal of the pull-up transistor to drive said control terminal in a state of extinction of the output buffer.

14 Claims, 4 Drawing Sheets

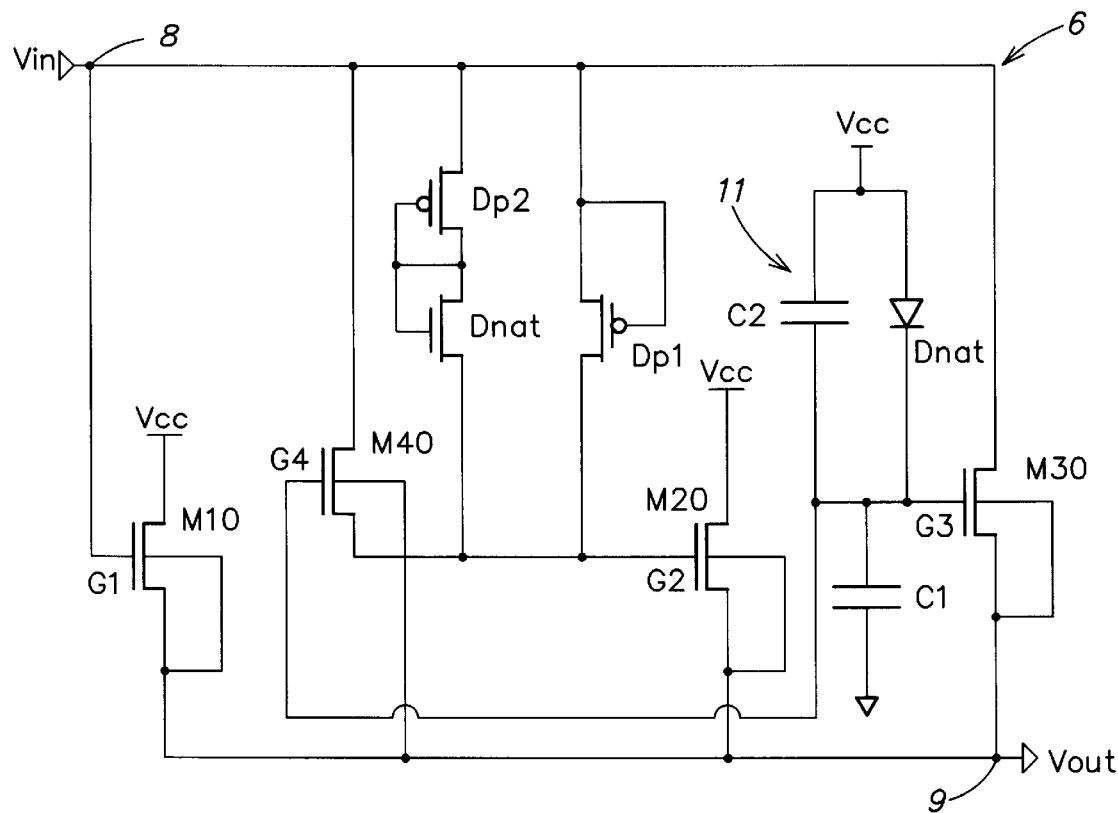
FIG. 5
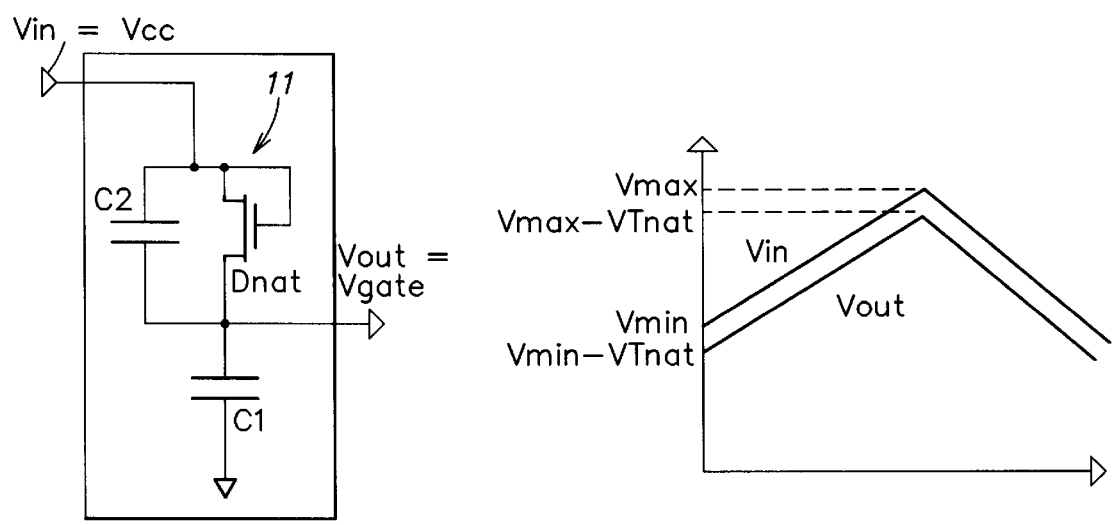
FIG. 6A  FIG. 6B

HIGH VOLTAGE TOLERANCE OUTPUT STAGE

BACKGROUND OF THE INVENTION

1. Field of Invention

The present invention relates to an output stage for high voltage tolerance electronic circuits. More particularly, the present invention relates to an output stage for a high voltage tolerance electronic circuit, the output stage having a protection device that protects against undesired starting up, and includes an output buffer made up of a complementary pair of transistors having a P-channel MOS pull-up transistor and an N-channel MOS pull-down transistor with these transistors being connected mutually to form an output terminal of the stage.

2. Discussion of the Related Art

As known to those skilled in the art, some electronic devices integrated on semiconductor and supplied with low supply voltage, e.g., 3 V, must sometimes be interconnected with other electronic devices operating with higher supply voltages, e.g., 5 V.

There are some problems in the use and management of resources common to both types of devices. For example, problems occur when a data bus is shared by different digital systems incorporating electronic circuits operating at 3 V and electronic circuits operating at 5 V.

In digital systems of this type there is normally present a logical control unit, e.g., a CPU (Central Processing Unit), which emits enable and disable signals for the various circuits sharing the data bus.

Specifically each circuit has control inputs and has a final output stage incorporating an output buffer made up essentially of a complementary pair of pull-up and pull-down circuits connected to the data bus. When a given circuit has to use the data bus, the CPU acts on the OE# (Output Enable) or CE (Chip Enable) signal inputs of the unused circuits to force the corresponding output buffers into an off state, or a "tristate."

A diagram of this situation is shown in FIG. 1 illustrating a group of electronic circuits sharing the same data bus even though operating with different supply voltages.

FIG. 1 also shows the bias voltages applied to the various output buffers when one of the circuits (in the example, the one with high power supply) is using the data bus.

From FIG. 1 it can be seen that each pull-up transistor of an output buffer that is turned off has its gate terminal and body terminal powered by a voltage Vcc of 3 V.

When the high power device (5 V) is operative the voltage on the data bus cannot reach the high logical level, i.e., 5 V, but is blocked at a Vcc value (3V)+min [|Vthp|, Vγ], where Vthp is the threshold voltage of a PMOS transistor, and Vγ drain-bulk voltage drop.

In the case where |Vthp|<Vγ, the PMOS transistor is turned on. Otherwise, the NMOS transistors is turned on.

This involves an undesired consumption by the active device, which is forced to power the currents 11 and 12.

FIG. 2 shows an enlarged vertical cross section of the internal structure of a P-channel MOS transistor provided in an N well. The symbols S, G and D indicate respectively the terminals of the source, gate and drain regions.

B indicates the body or bulk terminal of the transistor.

A conventional solution consists of providing a diode connected in parallel to the P-channel pull-up transistor of the output buffer. This diode is directly biased like the drain-bulk junction but turns on first because of an expected lower threshold voltage.

Other circuit solutions of known type do not protect the drain-bulk junction without causing consumption of the circuit. These meet the High Voltage Tolerance specification but consume current during stand-by operation.

SUMMARY OF THE INVENTION

A technical problem underlying the present invention is to conceive an electronic circuit output stage having high voltage tolerance and also having structural and functional characteristics allowing protection against undesired turning on which would also make current consumption virtually null when the output buffer of the stage is off.

This would overcome the limits and shortcomings of the present solutions offered by conventional solutions.

An embodiment of the invention is directed to an output stage for an electronic circuit with a high voltage tolerance. The output stage includes an output buffer including a complimentary transistor pair having a pull-up P-channel MOS transistor and a pull-down N-channel MOS transistor with the transistors being connected to form an output stage output terminal. The pull-up P-channel MOS transistor has a control terminal. The output stage further includes a switch having a switch input coupled to the output stage output terminal, and a switch output coupled to the control terminal of the pull-up P-channel MOS transistor to drive the output stage into a tristate condition.

The characteristics and advantages of the stage in accordance with the present invention are set forth in the description of an embodiment thereof given below by way of non-limiting example with reference to the drawings.

BRIEF DESCRIPTION OF THE DRAWINGS

FIG. 5 shows a diagrammatic view of a circuit detail of a detail of the stage of FIG. 4A;

FIG. 6A shows a diagrammatic view of a detail of the circuit of FIG. 5; and

FIG. 6B shows a chart of voltage signals present in the circuit of FIG. 5.

DETAILED DESCRIPTION

Figure 4A:
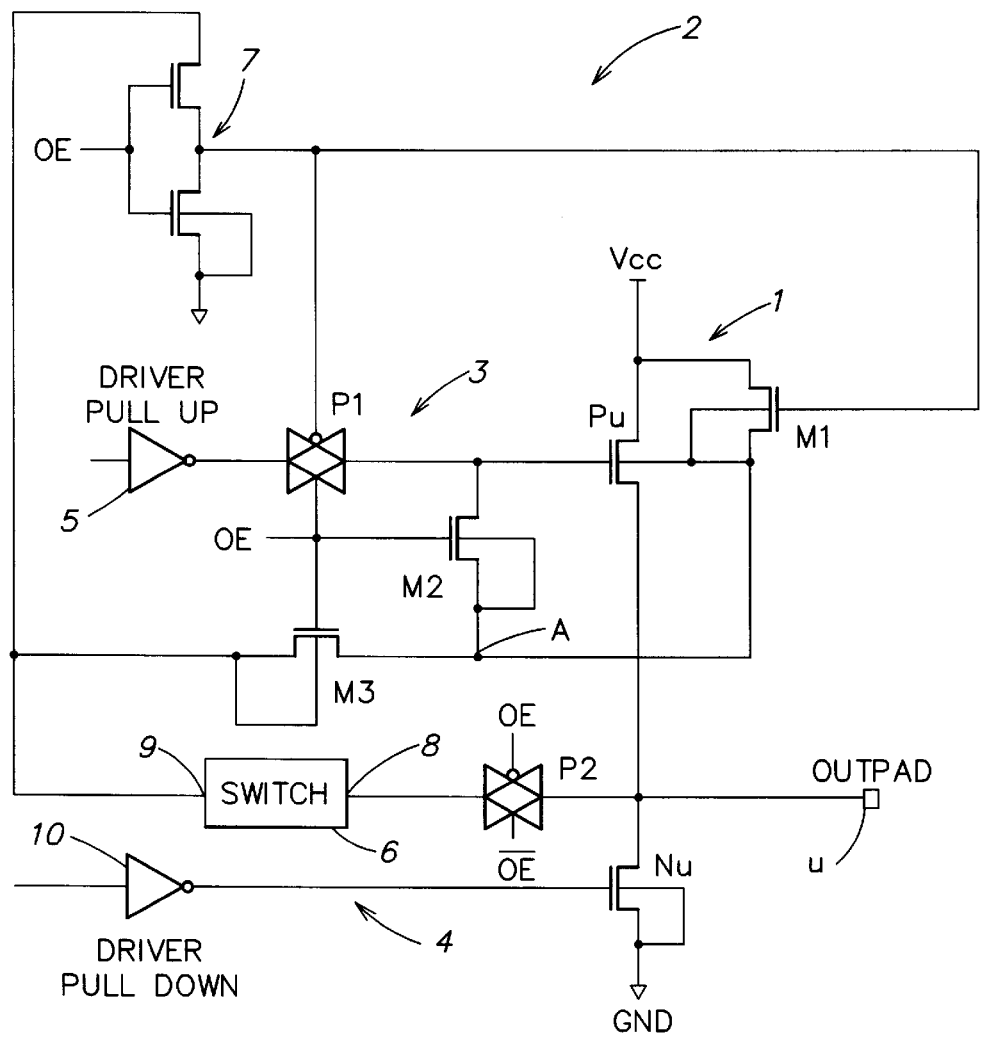
FIGS. 4A, 4B and 4C show respective diagrammatic views of an output stage provided in accordance with the present invention and in different operating conditions.

With reference to the above FIGS and in particular to the example of FIG. 4A, reference number 1 indicates as a whole and schematically a final output stage provided in accordance with the present invention for an electronic circuit 2.

The circuit 2 is represented only partially and by way of indication in FIG. 4A because it may be of varying type such as, e.g., a memory device, a reading circuit or some other circuit. Circuit 2 has at least one enable input, an operational portion whose operation is interlocked with the signal present on that input, and a final output stage which in our case corresponds to the stage 1.

The stage 1 includes a CMOS complementary transistor pair made up of a first P-channel pull-up transistor Pu connected in series with a second N-channel pull-down transistor Nu. These two transistors Pu and Nu are connected between a first reference supply voltage Vcc and a second reference voltage, e.g., a signal ground.

The point of connection between the transistors Pu and Nu corresponds to the output terminal U of the stage 1.

The circuit 2 calls for a drive portion 3 of the pull-up transistor Pu and a like portion 4 for driving the pull-down transistor Nu.

The first 3 of these portions includes essentially an inverter 5 having its output coupled to the control terminal of the transistor Pu through a pass-transistor P1.

The second portion 4 calls for a direct connection between the output of an inverter 10 and the control terminal of the pull-down transistor Nu.

A pass-transistor is virtually an enable circuit element having two inputs on which are applied mutually complementary signals.

One of the inputs of the pass-transistor P1 is connected to the output of a CMOS inverter 7 made up of a complementary transistor pair receiving in parallel on respective control terminals the same enable signal OE. The other input of the pass-transistor P1 receives this signal OE directly.

Advantageously in accordance with the present invention the stage 1 is equipped with a protection device against undesired turning on. This protection device includes a switch 6 having an input 8 and an output 9. The input 8 of the switch 6 is coupled to the output node U through a pass-transistor P2 receiving the signals OE and $\overline{OE}$.

The output 9 of the switch 6 is connected to power the inverter 7.

The switch 6 has a threshold and switching voltage Vs which is appropriately selected to be within the following range:

$$Vcc \leq Vs \leq Vcc + \min [|Vthp|, V\gamma] \qquad (1)$$

Preferably, for reasons clarified below, the voltage Vs was chosen equal to a Vcc+Vtnat, where Vtnat is the threshold voltage of a natural transistor and its value is less than min [|Vthp|, Vγ].

The structure of the stage 1 in accordance with the present invention further includes a first P-channel MOS transistor M1 having its control terminal coupled downstream of the output of the inverter 7.

The source terminal of the transistor M1 is connected to the reference supply voltage Vcc while the drain terminal and the body terminal of the transistor M1 are coupled to the control terminal of the pull-up transistor Pu through a MOS transistor M2.

A second M2 and a third M3 transistors, also of P-channel type, are disposed between the control terminal of the pull-up transistor Pu and the output 9 of the switch 6. On the control terminal of both these transistors M2 and M3 is applied the signal OE. The interconnection point between them is indicated as node A and is connected to the drain terminal of the first transistor M1.

There is now briefly described the operation of the stage 1 in accordance with the present invention and of the circuitry associated therewith.

When the electronic circuit 2 is active to perform, e.g., reading of the information transmitted on a data bus, the corresponding output buffer is turned on.

The enable signal OE has high logical value and the transistors M2 and M3 are off. Under these conditions the pass-transistor P2 is also off and the switch 6 is deactivated.

Figure 4B:
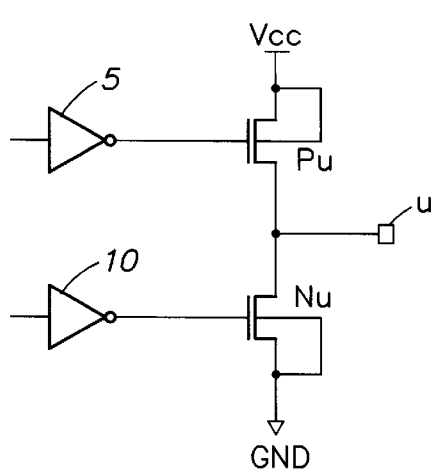

The transistor M1 and the pass-transistor P1 are on and the circuit shown in FIG. 4A is equivalent to an operational structure as shown in FIG. 4B.

Essentially when the output buffer is on, the respective inverters 5 and 10 directly drive the control terminals of the pull-up Pu and pull-down Nu.

When the CPU switches the logical value of the signal OE to take it to a low value, the state of the output buffer is forced into extinction, also called tristate.

Under these conditions the transistors M2 and M3 are turned on as is the pass-transistor P2. The transistor M1 and the pass-transistor P1 are turned off.

Figure 4C:
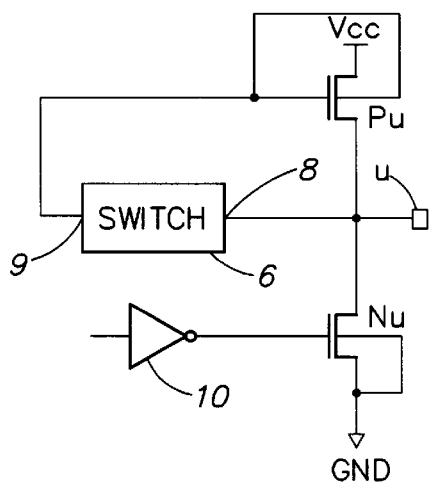

FIG. 4C diagrams this operational situation. In FIG. 4C, it can be seen that the output 9 of the switch 6 is directly connected to the control terminal and the bulk of the pull-up transistor Pu.

Accordingly, the stage in accordance with the present invention has the special characteristic of allowing direct connection between the output of the switch 6 and the gate and bulk regions of the output buffer pull-up. This connection is active only when the output buffer is in tristate.

During normal operation of the circuit 2, the switch 6 is disconnected.

The table below shows the various components of the switching circuit of the switch 6.

TABLE 1

| Buffer | OE | M1 | M2 | M3 | P1 | P2 | SW6 |
|---|---|---|---|---|---|---|---|
| ON | 1 | ON | OFF | OFF | ON | OFF | Deact |
| OFF | 0 | OFF | ON | ON | OFF | ON | Active |

Figure 1:
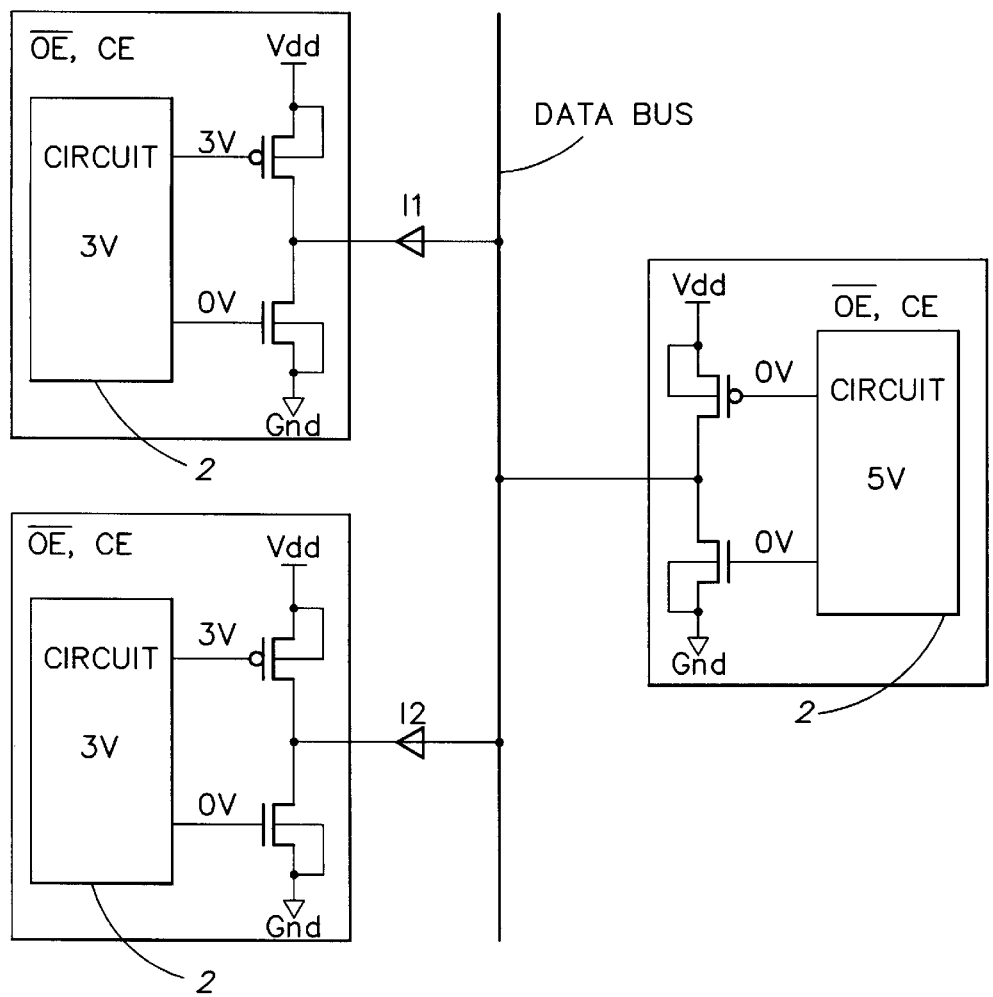
FIG. 1 shows a diagrammatic view of a group of electronic circuits having respective output stages connected to the same data bus.
Figure 2:
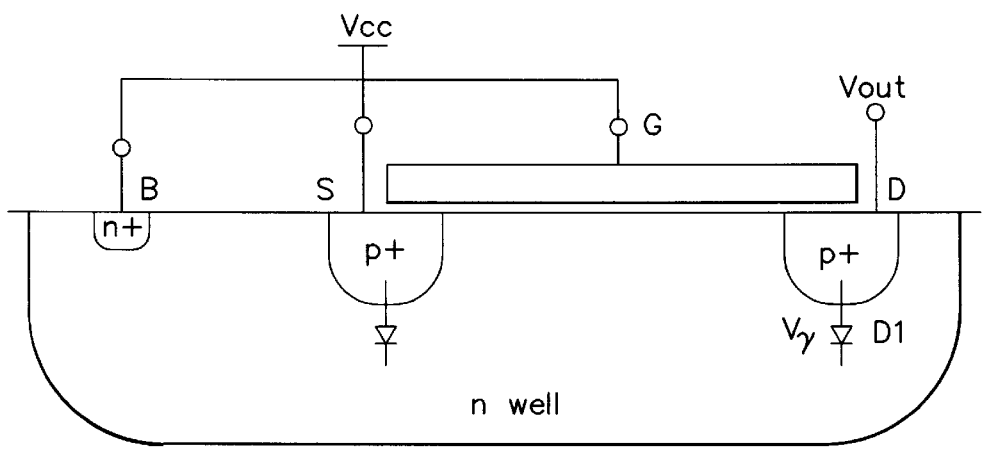
FIG. 2 shows a diagrammatic view of an enlarged vertical cross section of the internal structure of a P-channel MOS transistor provided in an N well of a semiconductor substrate.
Figure 3:
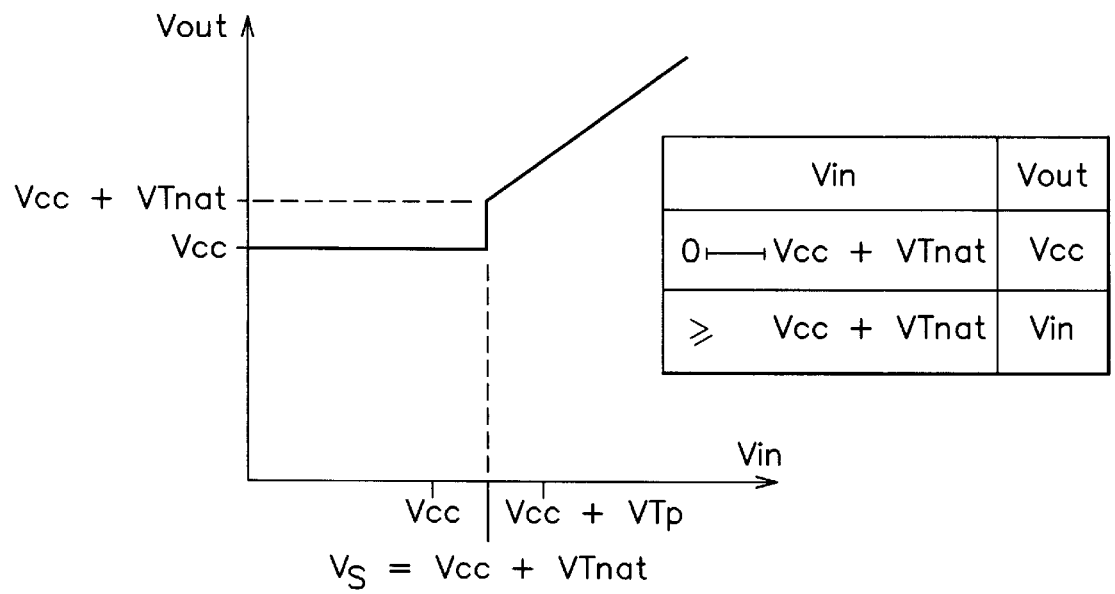
FIG. 3 shows a voltage-voltage diagram representative of the transfer function of a component of the output stage in accordance with the present invention.

FIG. 3 shows a transfer function Vin/Vout representing the output voltage Vout of the switch 6 for variations in the voltage Vin applied at input.

The switch 6 is capable of comparing the voltage present on the buffer output U with its own threshold voltage Vs and supplying at output the greater of the two values. The result of this behavior is given in the graph shown in FIG. 3 by a broken line corresponding to the values of the following table.

TABLE 2

| Vin | Vout |
|---|---|
| Vin ≤ Vcc + Vtnat | Vcc |
| Vin ≥ Vcc + Vtnat | Vin |

The threshold voltage Vs for switching of the switch 6 was chosen in the range defined by the (1) to avoid consumption of the active device.

Now with particular reference to the example of FIG. 5 there is described a preferred embodiment of the switch 6 associated with the output stage in accordance with the present invention.

The switch 6 has an input terminal 8 and an output terminal 9. The input terminal is connected to the control terminal G1 of a P-channel MOS transistor M10 inserted between the reference supply voltage Vcc and the output terminal 9.

A second P-channel MOS transistor M20 is in turn connected between the reference supply voltage Vcc and the output terminal 9 of the switch 6.

The control terminal G2 of the second transistor M20 is connected to the input 8 through a transistor Dp1 in diode configuration and biased directly to said control terminal G2.

A transistor pair Dp2 and Dnat in mutual series is connected in parallel with the above mentioned diode Dp1 but with opposite bias.

A third P-channel MOS transistor M30 is inserted in turn between the input 8 and the output 9. This third transistor M30 has its control terminal G3 connected to a capacitive divider 11.

Specifically the divider 11 includes a capacitor C2 connected to a capacitor C1 between the power supply reference and the second ground reference. The point of interconnection between the capacitors C2 and C1 is connected to the terminal G3. In addition a transistor Dnat in diode configuration is connected in parallel with the capacitor C2 with bias towards the supply voltage Vcc.

The structure of the switch 6 is completed by a fourth P-channel MOS transistor M40 having its drain terminal connected to the input 8, its source terminal connected to the control terminal G2 of the second transistor M20 and its bulk terminal connected to the output 9.

Even the control terminal G4 of the fourth transistor M40 is connected to the same capacitive divider 11.

We shall now discuss the specific operation of the switch 6 starting from an initial state in which the voltage Vin on the input 8 rises from the value 0 to the value Vcc−|vtp|.

Under these conditions the transistor M10 is on and holds the output voltage Vout at the value of the supply voltage Vcc.

The series connection of the transistors Dp2 and Dnat causes a voltage drop on the terminal G2 which reaches a potential voltage Vg2 equal to Vin−(|Vtp1|+Vtnat). The second transistor M20 is accordingly turned on until the input voltage Vin reaches the value Vcc+Vtnat.

The output terminal 9 is thus held at Vcc.

The transistors M30 and M40 turn on when on their drain terminals, connected to the input 8, the voltage Vin reaches the value Vcc−Vtnat+|Vtp|. This causes switching of the output 9 to a potential value equal to Vin. Even the voltage Vg2 takes on this value.

With present technology it is possible to define the value of Vtnat in such a manner as to determine the simultaneous turning on of the third transistor M30 and turning off of the second transistor M20. The value of Vin at which the switching takes place corresponds exactly to the threshold voltage Vs defined above.

The function of the fourth transistor M40 is to equalize the control terminal G3 of the third transistor M30 at the potential present on the drain terminal, all this for values of input voltage Vin higher than the sum of Vcc+Vtnat. This allows keeping the third transistor M30 turned off even for values of Vin=Vdrain higher than Vcc+|Vtp|.

Indeed, if the third transistor were driven with supply voltage Vcc the output voltage Vout could not exceed the value of Vcc+|Vtp| because of the third transistor M30 which would be in diode configuration.

The presence of the MOS transistor Dp2 allows lowering the potential on the terminal G2 of the second transistor M2 in the falling phase of the input voltage Vin.

The following table diagrams the above described operation.

TABLE 3

| Vin | M10 | M20 | M30 | M40 | Vout |
|---|---|---|---|---|---|
| 0 to Vcc − Vnat | ON | ON | OFF | OFF | Vcc |
| Vcc − \| Vtp \| to Vcc − Vnat + Vtp | OFF | ON | OFF | OFF | Vcc |
| ≧Vcc − Vnat + \| Vtp \| | OFF | OFF | ON | ON | Vin |

Essentially the output stage in accordance with the present invention achieves important advantages with respect to the prior art. The first of these advantages is permitting reaching of the full 5 V level on the bus side when the high voltage device is active and thus reducing to virtually zero consumption of the electronic circuits with high power supply connected to the data bus and made active when the low power supply circuits are deactivated.

In the case where |Vγ|<|Vthp| direct biasing of the drain-bulk junction of the pull-up transistor is avoided and, lastly, the output stage in accordance with the present invention can be made operative with zero consumption.

Furthermore, there is discussed an aspect of the present invention which is correlated with the possibility that the supply voltage Vcc might undergo variations in a range between a Vmin and a Vmax during operation of the output stage.

Reference is made to FIGS. 6A and 6B to discuss the answer of the present invention to this variation in the power supply.

The switch 6 functions correctly if the control terminal of the third transistor M30 manages to follow the value of the supply voltage Vcc in the above mentioned interval, unless there is a voltage drop equal to the threshold of a natural MOS.

The capacitive divider 11 was especially provided for this purpose. When the input voltage Vin equal to Vcc rises, the capacitor C1 is charged by the MOS in diode configuration Dnat and thus the output voltage Vout moves to Vcc−Vtnat.

On the other hand, during fall of Vcc, the diode Dnat is biased inversely and the discharge takes place through the capacitor C2.

The two capacitors C1 and C2 must be sized in such a manner that the voltage to which their common node would move in the absence of the diode Dnat would be less than Vcc−Vtnat.

This means that Vcc*C2/(C1+C2) must be less than Vcc−Vtnat and the output voltage Vout will be constrained to a minimum value equal to Vcc−Vtnat.

The output stage in accordance with the present invention accordingly functions correctly even with variations in the supply voltage Vcc.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An output stage for an electronic circuit with a high voltage tolerance, the output stage comprising:
   an output buffer including a complementary transistor pair having a pull-up P-channel MOS transistor and a pull-down N-channel MOS transistor with the transistors being connected together to form an output stage output terminal, the pull-up P-channel MOS transistor having a control terminal; and a switch having a switch input coupled to the output stage output terminal, and a switch output coupled to the control terminal of the pull-up P-channel MOS transistor to drive the output stage into a tristate condition wherein the switch has a switching threshold voltage, Vs, such that Vcc<Vs<(Vcc+min), wherein Vcc is a supply voltage, wherein Vtp is a threshold voltage of a P-channel transistor, and wherein Vγ is a threshold voltage of a drain-bulk junction.

2. The output stage of claim 1, further comprising:

a pass-transistor receiving a pair of signals in logical opposition, wherein the switch input is coupled to the output stage output terminal through the pass-transistor.

3. The output stage of claim 1, wherein the threshold voltage, Vs, is equal to Vcc+Vtnat, wherein Vtnat is a threshold voltage of a natural transistor.

4. An output stage for an electronic circuit with a high voltage tolerance, the output stage comprising:

an output buffer including a complementary transistor pair having a pull-up P-channel MOS transistor and a pull-down N-channel MOS transistor with the transistors being connected together to form an output stage output terminal, the pull-up P-channel MOS transistor having a control terminal; and a switch having a switch input coupled to the output stage output terminal, and a switch output coupled to the control terminal of the pull-up P-channel MOS transistor to drive the output stage into a tristate condition further comprising:

an inverter; and a first P-channel MOS transistor having a control terminal connected downstream of the inverter, a source terminal connected to a reference supply voltage, and a drain terminal and a body terminal that are coupled to the control terminal of the pull-up P-channel transistor through a second P-channel MOS transistor.

5. The output stage of claim 4, further comprising:

the second P-channel MOS transistor; and a third P-channel MOS transistor, wherein the second and third P-channel MOS transistors are configured as diodes and are disposed between the control terminal of the pull-up P-channel MOS transistor and the switch output, wherein each of the second and third P-channel MOS transistors has a control terminal for receiving a signal, and wherein an interconnection point between the second and third P-channel MOS transistors is connected to the drain terminal of the first P-channel MOS transistor.

6. An output stage for an electronic circuit with a high voltage tolerance, the output stage comprising:

an output buffer including a complementary transistor pair having a pull-up P-channel MOS transistor and a pull-down N-channel MOS transistor with the transistors being connected together to form an output stage output terminal, the pull-up P-channel MOS transistor having a control terminal; and a switch having a switch input coupled to the output stage output terminal, and a switch output coupled to the control terminal of the pull-up P-channel MOS transistor to drive the output stage into a tristate condition wherein the switch includes:

a first P-channel MOS transistor disposed between a reference supply voltage and the switch output, the first P-channel MOS transistor having a control terminal connected to the switch input;

a second P-channel MOS transistor connected between the reference supply voltage and the switch output, the second P-channel MOS transistor having a control terminal;

a diode configured transistor biased toward the control terminal of the second P-channel MOS transistor, the second P-channel MOS transistor being connected to the switch input through the diode configured transistor; and a pair of transistors in diode configuration and in series, the pair of transistors being connected in parallel with the diode configured transistor and biased in a direction that is opposite to that of the diode configured transistor.

7. The output stage of claim 6, wherein the switch further includes:

a capacitive divider having a first capacitor and a second capacitor connected between a power supply reference and a second ground reference;

a third P-channel MOS transistor in a diode configuration, the third P-channel transistor being disposed between the switch input and the switch output, and having a control terminal; and a fourth P-channel MOS transistor having a control terminal, an interconnection point between the capacitors being connected to the control terminal of the third P-channel MOS transistor and the control terminal of the fourth P-channel MOS transistor.

8. The output stage of claim 7, wherein the switch further includes a diode connected in parallel to the first capacitor with bias toward the power supply reference.

9. The output stage of claim 6, wherein the switch further includes:

a capacitive divider; and a fourth P-channel MOS transistor having a drain terminal connected to the switch input, a source terminal connected to the control terminal of the second P-channel transistor, a bulk terminal connected to the switch output, and a control terminal connected to the capacitive divider.

10. An output stage for an electronic circuit, the output stage comprising:

an output terminal;

an output buffer having a pull-up transistor disposed between a first voltage supply terminal and the output terminal, and a pull-down transistor disposed between the output terminal and a second voltage supply terminal, wherein the pull-up transistor includes a control terminal; and a switch having a switch input coupled to the output terminal, and a switch output coupled to the control terminal of the pull-up transistor to control the pull-up transistor;

wherein the first voltage supply terminal is arranged to receive a supply voltage; wherein the switch input is arranged to receive a switch input voltage; and wherein the switch is arranged to provide selectively one of the supply voltage and the switch input voltage on the switch output;

wherein the switch is arranged to provide, on the switch output, the supply voltage when the switch input voltage is less than the supply voltage; and wherein the switch is arranged to provide, on the switch output, the switch input voltage when the switch input voltage substantially exceeds the supply voltage.

11. The output stage of claim 10, further including a pass-transistor disposed between the output terminal and the switch input.

12. An output stage for an electronic circuit, the output stage comprising:

an output terminal;

an output buffer having a pull-up transistor disposed between a first voltage supply terminal and the output terminal, and a pull-down transistor disposed between the output terminal and a second voltage supply terminal, wherein the pull-up transistor includes a control terminal, and wherein the first voltage supply terminal is arranged to receive a supply voltage; and control means, responsive to an input voltage, for providing selectively one of the supply wherein the control means includes means for providing to the control terminal of the pull-up transistor the supply voltage when the input voltage is less than the supply voltage;

wherein the control means includes means for providing to the control terminal of the pull-up transistor the input voltage when the input voltage substantially exceeds the supply voltage.

13. A high voltage tolerant circuit, comprising:

a first stage having a first output and a second output; and an output stage that is driven by the first stage, the output stage including:

an output terminal, an output buffer having a pull-up transistor disposed between a first voltage supply terminal and the output terminal, and a pull-down transistor disposed between the output terminal and a second voltage supply terminal, wherein the pull-up transistor includes a control terminal coupled to the first output of the first stage, and wherein the pull-down transistor includes a control terminal coupled to the second output of the first stage, and a switch having a switch input coupled to the output terminal, and a switch output coupled to the control terminal of the pull-up transistor to control the pull-up transistor wherein the switch has a switching threshold voltage, Vs, such that $Vcc<Vs<(Vcc+\min[|Vtp|,V\gamma])$, wherein Vcc is a supply voltage, wherein Vtp is a threshold voltage of a P-channel transistor, and wherein $V\gamma$ is a threshold voltage of a drain-bulk junction.

14. A high voltage tolerant circuit, comprising:

a first stage having a first output and a second output; and an output stage that is driven by the first stage, the output stage including:

an output terminal;

an output buffer having a pull-up transistor disposed between a first voltage supply terminal and the output terminal, and a pull-down transistor disposed between the output terminal and a second voltage supply terminal, wherein the pull-up transistor includes a control terminal coupled to the first output of the first stage, wherein the pull-down transistor includes a control terminal coupled to the second output of the first stage, and wherein the first voltage supply terminal is arranged to receive a supply voltage; and control means, responsive to an input voltage, for providing selectively one of the supply voltage and the input voltage to the control terminal of the pull-up transistor;

wherein tile control means includes means for providing to the control terminal of the pull-up transistor the supply voltage when the input voltage is less than the supply voltage; and wherein the control means includes means for providing to the control terminal of the pull-up transistor the input voltage when the input voltage substantially exceeds the supply voltage.

* * * * *